United States Patent
Long

(10) Patent No.: US 12,324,242 B2
(45) Date of Patent: Jun. 3, 2025

(54) ARRAY SUBSTRATE, DISPLAY PANEL, AND DISPLAY TERMINAL

(71) Applicant: WUHAN CHINA STAR OPTOELECTRONICS TECHNOLOGY CO., LTD., Hubei (CN)

(72) Inventor: Shiyu Long, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 624 days.

(21) Appl. No.: 17/780,031

(22) PCT Filed: May 23, 2022

(86) PCT No.: PCT/CN2022/094479
§ 371 (c)(1),
(2) Date: May 26, 2022

(87) PCT Pub. No.: WO2023/216315
PCT Pub. Date: Nov. 16, 2023

(65) Prior Publication Data
US 2023/0369351 A1    Nov. 16, 2023

(30) Foreign Application Priority Data
May 11, 2022    (CN) .......................... 202210513793.1

(51) Int. Cl.
*H10D 86/60*    (2025.01)
*H10D 86/40*    (2025.01)

(52) U.S. Cl.
CPC .......... *H10D 86/60* (2025.01); *H10D 86/443* (2025.01)

(58) Field of Classification Search
CPC ............................. H10D 86/60; H10D 86/443
(Continued)

(56) References Cited

U.S. PATENT DOCUMENTS

2013/0240886 A1*    9/2013    Yeh ...................... H10D 86/471
257/57
2019/0198534 A1    6/2019    Je et al.

FOREIGN PATENT DOCUMENTS

| CN | 111785740 A | 10/2020 |
| CN | 111863837 A | 10/2020 |

(Continued)

OTHER PUBLICATIONS

International Search Report in International application No. PCT/CN2022/094479, mailed on Nov. 30, 2022.
(Continued)

*Primary Examiner* — Igwe U Anya
(74) *Attorney, Agent, or Firm* — Rivka Friedman

(57) ABSTRACT

An array substrate, a display panel, and a display terminal are provided. The array substrate includes: a substrate; a first active layer disposed on the substrate; a first metal layer including a source electrode electrically connected to one end of the first active layer and a first gate electrode disposed opposite to the first active layer; a second active layer disposed on the first metal layer and electrically connected to the first active layer, wherein, the first gate electrode is disposed opposite to the second active layer; and a second metal layer including a drain electrode electrically connected to the second active layer.

20 Claims, 4 Drawing Sheets

(58) Field of Classification Search
USPC .......................................................... 257/59
See application file for complete search history.

(56) References Cited

FOREIGN PATENT DOCUMENTS

| CN | 112599571 A | | 4/2021 |
| CN | 113113425 A | * | 7/2021 |
| CN | 113809099 A | | 12/2021 |

OTHER PUBLICATIONS

Written Opinion of the International Search Authority in International application No. PCT/CN2022/094479, mailed on Nov. 30, 2022.

* cited by examiner

| Providing a substrate, forming a signal line and a buffer layer which covers the signal line on the substrate, forming a shielding layer and a first interlayer insulating layer which covers the shielding layer on the buffer layer, and forming a first active layer on the first interlayer insulating layer. | ～ S1 |

↓

| Forming a first gate insulating layer on the first interlayer insulating layer and forming a first metal layer on the first gate insulating layer, wherein, the first metal layer includes a first gate electrode and a source electrode, and the source electrode is electrically connected to the signal line and the first active layer in sequence. | ～ S2 |

↓

| Forming a second gate insulating layer on the first metal layer, forming a second active layer on the second gate insulating layer, forming a third gate insulating layer that covers the second active layer on the second gate insulating layer, forming a first through-hole on the third gate insulating layer toward the first active layer, and forming a third metal layer on the third gate insulating layer, wherein, the third metal layer includes an adapter terminal electrically connected to the second source region of the second active layer and the first drain region of the first active layer by the first through-hole. | ～ S3 |

↓

| Forming a second interlayer insulating layer that covers the third metal layer on the third gate insulating layer, and forming a second metal layer on the second interlayer insulating layer, wherein, the second metal layer includes a drain electrode electrically connected to the second drain region of the second active layer. | ～ S4 |

↓

| Forming a planarization layer on the second interlayer insulating layer, forming a pixel electrode on the planarization layer, and forming a protective layer that covers the pixel electrode on the planarization layer, wherein, the pixel electrode is electrically connected to the drain electrode, thereby obtaining an array substrate. | ～ S5 |

FIG. 5

ARRAY SUBSTRATE, DISPLAY PANEL, AND DISPLAY TERMINAL

FIELD OF INVENTION

The present disclosure relates to the field of display technologies, and more particularly, to an array substrate, a display panel, and a display terminal.

BACKGROUND OF INVENTION

With development of 5G communication technologies, virtual reality (VR) software and hardware have been improved. VR technologies are in a period of rapid development, and VR technologies have very high requirements on pixel densities (pixels per inch, PPI) of screens (>1000 PPI). Limited by the requirements for ultra-high PPI in VR, channel lengths of active layers of thin film transistors of array substrates in current VR are short, which cause devices to have poor stability.

Technical problem: the channel lengths of the active layers of the thin film transistors of the array substrates in current VR are short, which cause the devices to have poor stability.

SUMMARY OF INVENTION

In view of this, the present disclosure provides an array substrate, a display panel, and a display terminal, which can increase a channel length of active layers, thereby improving stability of devices.

In order to solve the above problems, the present disclosure provides technical solutions as follows.

In a first aspect, the present disclosure provides an array substrate, which includes:
- a substrate;
- a first active layer disposed on the substrate, wherein, the first active layer includes a first source region, a first drain region, and a first channel region located between the first source region and the first drain region;
- a first metal layer disposed on the first active layer, wherein, the first metal layer includes a source electrode and a first gate electrode, the source electrode is electrically connected to the first source region of the first active layer, and the first gate electrode is disposed opposite to the first channel region of the first active layer;
- a second active layer disposed on the first metal layer and opposite to the first active layer, wherein, the second active layer includes a second source region, a second drain region, and a second channel region located between the second source region and the second drain region, the second source region of the second active layer is electrically connected to the first drain region of the first active layer, and the first gate electrode is disposed opposite to the second channel region of the second active layer; and
- a second metal layer disposed on the second active layer, wherein, the second metal layer includes a drain electrode electrically connected to the second drain region of the second active layer.

In an optional embodiment of the present disclosure, the array substrate further includes a third metal layer disposed between the second active layer and the second metal layer, and the third metal layer includes an adapter terminal electrically connected to both the first drain region of the first active layer and the second source region of the second active layer.

In an optional embodiment of the present disclosure, the first gate electrode controls the first active layer and the second active layer simultaneously.

In an optional embodiment of the present disclosure, the third metal layer further includes a second gate electrode disposed opposite to the second active layer, the first gate electrode controls the first active layer, and the second gate electrode controls the second active layer.

In an optional embodiment of the present disclosure, the array substrate further includes a signal line and a shielding layer, the signal line is disposed on the substrate, a projection of the first active layer on the signal line is within the signal line, the source electrode is electrically connected to the signal line, and the shielding layer is disposed between the signal line and the first active layer; and
  the third metal layer further includes a first signal terminal electrically connected to the shielding layer.

In an optional embodiment of the present disclosure, the array substrate further includes a pixel electrode disposed on the second metal layer and electrically connected to the drain electrode.

In an optional embodiment of the present disclosure, the second metal layer further includes a second signal terminal, the array substrate further includes a common electrode disposed on the second metal layer and opposite to the pixel electrode, and the common electrode is electrically connected to the second signal terminal.

In an optional embodiment of the present disclosure, the array substrate further includes a first gate insulating layer, a second gate insulating layer, and a third gate insulating layer, wherein, the first gate insulating layer is disposed between the first active layer and the first metal layer, the second gate insulating layer is disposed between the first metal layer and the second active layer, the third gate insulating layer is disposed between the second active layer and the third metal layer, and the third metal layer is disposed on the third gate insulating layer; the array substrate further includes a first through-hole penetrating through the first gate insulating layer, the second gate insulating layer, and the third gate insulating layer; and the first through-hole is filled with a conductive material having a same material as the first signal terminal, and the first signal terminal is electrically connected to the first active layer and the second active layer by the conductive material in the first through-hole.

In an optional embodiment of the present disclosure, the first through-hole further penetrates through the second active layer; or
  one end of the first active layer and one end of the second active layer are exposed from the first through-hole and electrically connected to the conductive material.

In a second aspect, the present disclosure further provides a display panel, which includes an opposite substrate and an array substrate, wherein, the opposite substrate is disposed opposite to the array substrate and away from a substrate, and the array substrate includes:
  the substrate;
  a first active layer disposed on the substrate, wherein, the first active layer includes a first source region, a first drain region, and a first channel region located between the first source region and the first drain region;
  a first metal layer disposed on the first active layer, wherein, the first metal layer includes a source electrode and a first gate electrode, the source electrode is electrically connected to the first source region of the first active layer, and the first gate electrode is disposed opposite to the first channel region of the first active layer;

a second active layer disposed on the first metal layer and opposite to the first active layer, wherein, the second active layer includes a second source region, a second drain region, and a second channel region located between the second source region and the second drain region, the second source region of the second active layer is electrically connected to the first drain region of the first active layer, and the first gate electrode is disposed opposite to the second channel region of the second active layer; and a second metal layer disposed on the second active layer, wherein, the second metal layer includes a drain electrode electrically connected to the second drain region of the second active layer.

In an optional embodiment of the present disclosure, the array substrate further includes a third metal layer disposed between the second active layer and the second metal layer, and the third metal layer includes an adapter terminal electrically connected to both the first drain region of the first active layer and the second source region of the second active layer.

In an optional embodiment of the present disclosure, the first gate electrode controls the first active layer and the second active layer simultaneously.

In an optional embodiment of the present disclosure, the third metal layer further includes a second gate electrode disposed opposite to the second active layer, the first gate electrode controls the first active layer, and the second gate electrode controls the second active layer.

In an optional embodiment of the present disclosure, the array substrate further includes a signal line and a shielding layer, the signal line is disposed on the substrate, a projection of the first active layer on the signal line is within the signal line, the source electrode is electrically connected to the signal line, and the shielding layer is disposed between the signal line and the first active layer; and the third metal layer further includes a first signal terminal electrically connected to the shielding layer.

In an optional embodiment of the present disclosure, the array substrate further includes a pixel electrode disposed on the second metal layer and electrically connected to the drain electrode.

In an optional embodiment of the present disclosure, the second metal layer further includes a second signal terminal, the array substrate further includes a common electrode disposed on the second metal layer and opposite to the pixel electrode, and the common electrode is electrically connected to the second signal terminal.

In a third aspect, the present disclosure further provides a display terminal, which includes a main body and a display panel fixed onto the main body, wherein, the display panel includes an opposite substrate and an array substrate, the opposite substrate is disposed opposite to the array substrate and away from a substrate, and the array substrate includes:

the substrate;

a first active layer disposed on the substrate, wherein, the first active layer includes a first source region, a first drain region, and a first channel region located between the first source region and the first drain region;

a first metal layer disposed on the first active layer, wherein, the first metal layer includes a source electrode and a first gate electrode, the source electrode is electrically connected to the first source region of the first active layer, and the first gate electrode is disposed opposite to the first channel region of the first active layer;

a second active layer disposed on the first metal layer and opposite to the first active layer, wherein, the second active layer includes a second source region, a second drain region, and a second channel region located between the second source region and the second drain region, the second source region of the second active layer is electrically connected to the first drain region of the first active layer, and the first gate electrode is disposed opposite to the second channel region of the second active layer; and a second metal layer disposed on the second active layer, wherein, the second metal layer includes a drain electrode electrically connected to the second drain region of the second active layer.

In an optional embodiment of the present disclosure, the array substrate further includes a third metal layer disposed between the second active layer and the second metal layer, and the third metal layer includes an adapter terminal electrically connected to both the first drain region of the first active layer and the second source region of the second active layer.

In an optional embodiment of the present disclosure, the first gate electrode controls the first active layer and the second active layer simultaneously.

In an optional embodiment of the present disclosure, the third metal layer further includes a second gate electrode disposed opposite to the second active layer, the first gate electrode controls the first active layer, and the second gate electrode controls the second active layer.

Beneficial effect: in the array substrate provided in the embodiments, by disposing the first active layer and the second active layer in a stack in a direction perpendicular to the substrate and electrically connecting the drain region of the first active layer to the source region of the second active layer, a length of channel regions (the first channel region and the second channel region) of drive transistors can be increased. Therefore, the problem of device stability can be solved, and an area occupied by the drive transistors on the substrate is not increased.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

FIG. 5 is a flowchart of a manufacturing method of an array substrate according to an embodiment of the present disclosure.

DETAILED DESCRIPTION OF PREFERRED EMBODIMENTS

Figure 1:
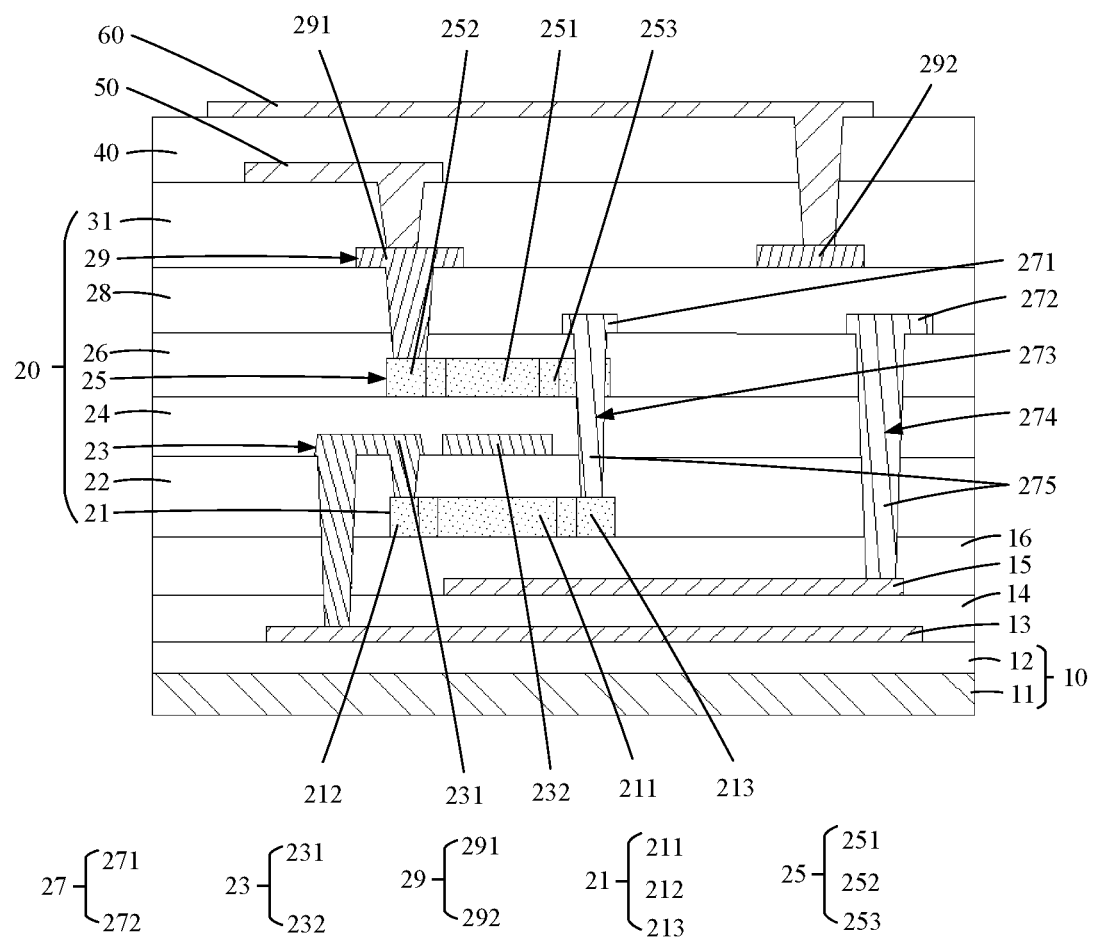
FIG. 1 is a schematic cross-sectional diagram of an array substrate according to a first embodiment of the present disclosure.

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure.

In addition, in the description of the present disclosure, it should be understood that terms such as "on", "under", as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or implicitly indicating the number of technical features indicated. Thus, features limited by "first" and "second" are intended to indicate or imply including one or more than one these features. In the description of the present disclosure, "a plurality of" relates to two or more than two, unless otherwise specified.

The present disclosure may repeat reference numerals and/or reference letters in different examples, which are for the purpose of simplicity and clarity, and do not indicate the relationship between the various embodiments and/or arrangements discussed.

An array substrate, a display panel, and a display terminal provided in the present disclosure will be described in detail below in conjunction with specific embodiments and the accompany drawings.

Referring to FIG. 1, A first embodiment of the present disclosure provides an array substrate 100. The array substrate 100 includes a substrate 10 and a drive transistor 20 disposed on the substrate 10.

In this embodiment, the substrate 10 includes a transparent glass 11 and a silicon oxide layer 12, and the silicon oxide layer 12 is disposed on the transparent glass 11.

In other embodiments, the substrate 10 may include only the transparent glass 11, or be made of materials other than the transparent glass.

Wherein, the drive transistor 20 includes a first active layer 21, a first metal layer 23, a second active layer 25, and a second metal layer 29. The first active layer 21 is disposed on the substrate 10, the first metal layer 23 is disposed on the first active layer 21, the second active layer 25 is disposed on the first metal layer 23, and the second metal layer 29 is disposed on the second active layer 25. The first metal layer 23 includes a source electrode 231 and a first gate electrode 232, the source electrode 231 is electrically connected to one end of the first active layer 21, and the first gate electrode 232 is disposed opposite to the first active layer 21. The second active layer 25 is disposed opposite to and electrically connected to the first active layer 21, and the first gate electrode 232 is disposed opposite to the second active layer 25. The second metal layer 29 includes a drain electrode 291 electrically connected to the second active layer 25.

Specifically, the first active layer 21 includes a first channel region 211 and a first source region 212 and a first drain region 213 formed on both sides of the first channel region 211. The source electrode 231 is electrically connected to the first source region 212, and the first gate electrode 232 is disposed opposite to the first channel region 211.

Specifically, the second active layer 25 includes a second channel region 251 and a second drain region 252 and a second source region 253 formed on both sides of the second channel region 251. The second channel region 251 is disposed opposite to the first channel region 211, and the first gate electrode 232 is disposed between the second channel region 251 and the first channel region 211. The second drain region 252 is disposed opposite to the first source region 212, the second source region 253 is disposed opposite to the first drain region 213, and the second source region 253 is electrically connected to the first drain region 213.

Specifically, the first source region 212, the first drain region 213, the second drain region 252, and the second source region 253 are all divided into heavily doped regions (N+) and lightly doped regions (N−). The lightly doped regions (N−) of the first active layer 21 are located between the first channel region 211 and the heavily doped regions (N+). The lightly doped regions (N−) of the second active layer 25 are located between the second channel region 211 and the heavily doped regions (N+).

In this embodiment, the first gate electrode 232 controls the first active layer 21 and the second active layer 25 simultaneously.

In this embodiment, the array substrate 100 further includes a signal line 13 formed on the substrate 10, a buffer layer 14 formed on the signal line 13, a shielding layer 15 formed on the buffer layer 14, and a first interlayer insulating layer 16 formed on the shielding layer 15. Specifically, in this embodiment, the signal line 13 is formed on the silicon oxide layer 12, and the first active layer 21 is formed on the first interlayer insulating layer 16. A projection of the first active layer 21 on the signal line 13 is within the signal line 13, the source electrode 231 is electrically connected to the signal line 13, and the shielding layer 15 is disposed between the signal line 13 and the first active layer 21. Specifically, in this embodiment, the first channel region 211 and the first drain region 213 of the first active layer 21 overlap with the shielding layer 15.

Wherein, the signal line 13 may not only shield light from a bottom of the drive transistor 20, but also receive external signals. The external signals flow into the source electrode 231, the first active layer 21, and the second active layer 25 sequentially from the signal line 13.

Wherein, the shielding layer 15 is used as an electromagnetic shielding layer for shielding an influence of the signal line 13 on the first channel region 211 of the drive transistor 20.

Specifically, the drive transistor 20 further includes a third metal layer 27, the third metal layer 27 is disposed between the second active layer 25 and the second metal layer 29, and the third metal layer 27 includes an adapter terminal 271 and a first signal terminal 272. The first active layer 21 and the second active layer 25 are connected to each other by the adapter terminal 271. The first signal terminal 272 is electrically connected to the shielding layer 15 for inputting electromagnetic shielding signals to the shielding layer 15.

The drive transistor 20 further includes a first gate insulating layer 22, a second gate insulating layer 24, and a third gate insulating layer 26. The first gate insulating layer 22 is disposed between the first active layer 21 and the first metal layer 23, the second gate insulating layer 24 is disposed between the first metal layer 23 and the second active layer 25, and the third gate insulating layer 26 is disposed between the second active layer 25 and the third metal layer 27. The third metal layer 27 is disposed on the third gate insulating layer 26.

The drive transistor 20 further includes a first through-hole 273 penetrating through the first gate insulating layer 22, the second gate insulating layer 24, and the third gate insulating layer 26. The first through-hole 273 is filled with a conductive material 275 having a same material as the adapter terminal 271 (the third metal layer 27), and the adapter terminal 271 is electrically connected to the first active layer 21 and the second active layer 25 by the conductive material 275 in the first through-hole 273. In this embodiment, the first through-hole 273 also penetrates through the second source region 253 of the second active layer 25. In other embodiments, the first through-hole 273 may also not penetrate through the second source region 253 of the second active layer 25. The first drain region 213 of the first active layer 21 and the second source region 253 of the second active layer 25 are exposed from the first through-hole 273 and are electrically connected to the conductive material 275.

Wherein, the drive transistor 20 further includes at least one second through-hole 274 penetrating through the first gate insulating layer 22, the second gate insulating layer 24, the third gate insulating layer 26, and the first interlayer insulating layer 16. The second through-hole 274 is filled with the conductive material 275 having a same material as the first signal terminal 272 (the third metal layer 27), and the first signal terminal 272 is electrically connected to the shielding layer 15 by the conductive material 275 in the second through-hole 274.

Wherein, the drive transistor 20 further includes a second interlayer insulating layer 28 and a planarization layer 31, the second interlayer insulating layer 28 is formed on the third metal layer 27, the second metal layer 29 is formed on the second interlayer insulating layer 28, and the planarization layer 31 is formed on the second interlayer insulating layer 28 and covers the second metal layer 29.

Wherein, the drain electrode 291 is electrically connected to the second drain region 252 of the second active layer 25 by a third through-hole (not numbered in the figures), and the third through-hole penetrates the second interlayer insulating layer 28 and the third gate insulating layer 26.

Wherein, the array substrate 100 further includes a pixel electrode 50 and a protective layer 40. The pixel electrode 50 is disposed on the second metal layer 29 and is electrically connected to the drain electrode 291. Specifically, the pixel electrode 50 is formed on the planarization layer 31, and the protective layer 40 is formed on the planarization layer 31 and covers the pixel electrode 50. The pixel electrode 50 is electrically connected to the drain electrode 291. Specifically, the pixel electrode 50 is electrically connected to the drain electrode 291 by at least one fourth through-hole (not numbered in the figures), and the fourth through-hole penetrates the planarization layer 31. The external signals flow into the pixel electrode 50 from the drain electrode 291 to drive the pixel electrode 50 to work.

In this embodiment, the second metal layer 29 further includes a second signal terminal 292, the array substrate 100 further includes a common electrode 60 disposed on the second metal layer 29 and opposite to the pixel electrode 50, and the common electrode 60 is electrically connected to the second signal terminal 292. The second signal terminal 292 is used to input common electrode signals to the common electrode 60. Specifically, the common electrode 60 is formed on the protective layer 40. In other embodiments, the second metal layer 29 may not include the second signal terminal 292, and the array substrate 100 may also not include the common electrode 60.

In the array substrate 100 provided in the embodiment, by disposing the first active layer 21 and the second active layer 25 in a stack in a direction perpendicular to the substrate 10, electrically connecting the drain region of the first active layer 21 to the source region of the second active layer 25, and simultaneously controlling the first active layer 21 and the second active layer 25 by the first gate electrode 232, a length of the channel regions (the first channel region 211 and the second channel region 251) of the drive transistor 20 in a vertical direction can be increased. Therefore, the problem of device stability can be solved, and an area occupied by the drive transistor 20 on the substrate is not increased.

Figure 2:
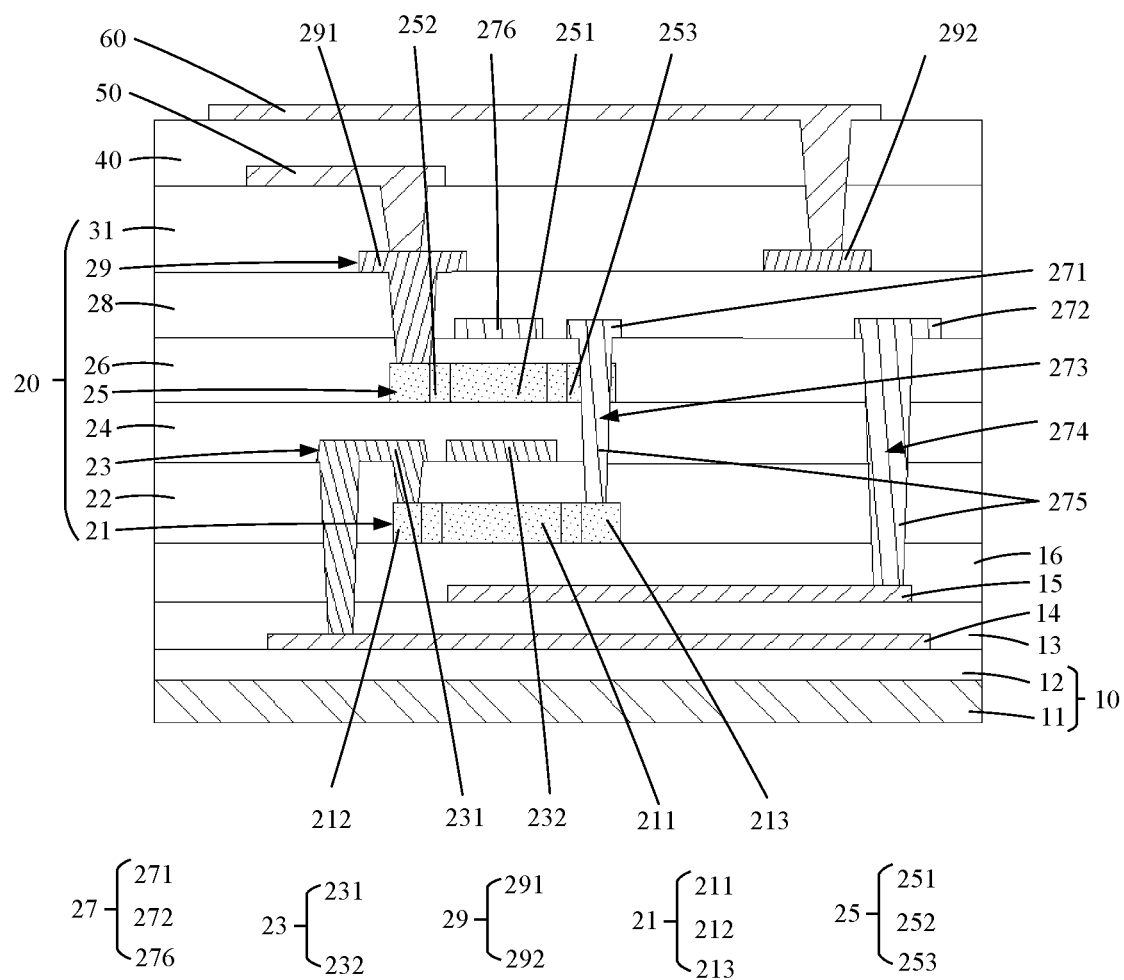
FIG. 2 is a schematic cross-sectional diagram of the array substrate according to a second embodiment of the present disclosure.

Referring to FIG. 2, a second embodiment of the present disclosure further provides an array substrate 200. A structure of the array substrate 200 is basically same as that of the array substrate 100. An only difference is that in the array substrate 200, the third metal layer 27 further includes a second gate electrode 276 disposed in a same layer and made of a same material as the adapter terminal 271 and the first signal terminal 272. The second gate electrode 276 is formed on the third gate insulating layer 26 and is disposed opposite to the second channel region 251 of the second active layer 25. The first gate electrode 232 controls the first active layer 21, and the second gate electrode 276 controls the second active layer 25.

In the array substrate 200 provided in the embodiment, by disposing the first active layer 21 and the second active layer 25 in the stack in the direction perpendicular to the substrate 10, electrically connecting the drain region of the first active layer 21 to the source region of the second active layer 25, and controlling the first active layer 21 by the first gate electrode 232 and controlling the second active layer 25 by the second gate electrode 276, double gates are formed in the vertical direction, and the length of the channel regions (the first channel region 211 and the second channel region 251) of the drive transistor 20 can be increased. Therefore, the problem of device stability can be solved, and the area occupied by the drive transistor 20 on the substrate is not increased. Compared with the single-gate structure of the array substrate 100, the device stability of the double-gate structure of the array substrate 200 is better. In addition, in the manufacturing processes of the array substrate 200, the second gate electrode 276 can also shield the second active layer 25 to facilitate light doping with phosphorus ions to form the lightly doped regions (N−).

Figure 3:
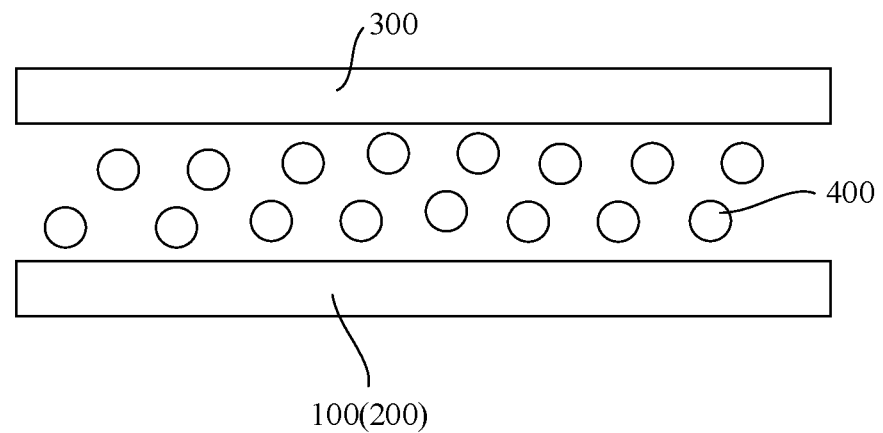
FIG. 3 is a schematic cross-sectional diagram of a display panel according to an embodiment of the present disclosure.

Referring to FIG. 3, the present disclosure further provides a display panel 1001, which includes an opposite substrate 300 and the array substrate 100 or 200 mentioned above. The opposite substrate 300 is disposed opposite to the array substrate 100 or 200 and away from the substrate 10.

In this embodiment, the display panel 1001 is a liquid crystal display panel, and the display panel 1001 further includes liquid crystals 400 disposed between the array substrate 100 or 200 and the opposite substrate 300. The opposite substrate 300 is a color filter substrate.

In other embodiments, the display panel 1001 may also be a light-emitting diode (LED) display panel, a micro-LED display panel, a mini-LED display panel, or an electronic paper. In this case, the opposite substrate is a light-emitting structure, and the opposite substrate 300 includes an anode, a light-emitting layer, and a cathode.

Figure 4:
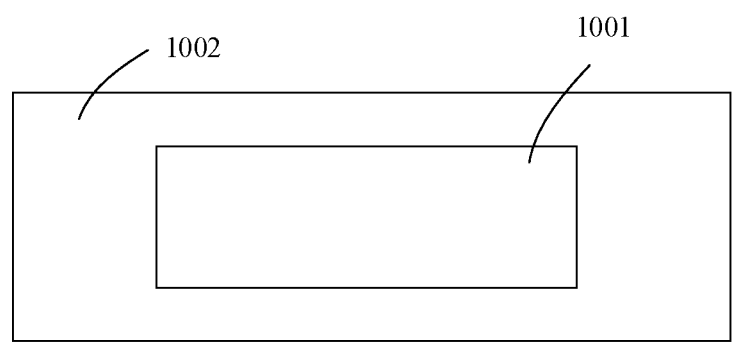
FIG. 4 is a schematic diagram of a display terminal according to an embodiment of the present disclosure.

Referring to FIG. 4, the present disclosure further provides a display terminal 1000, which includes a main body 1002 and the display panel 1001 described above, and the display panel 1001 is fixed onto the main body 1002. The display terminal 1000 may be a mobile phone, a computer, a watch, a display screen, etc.

Referring to FIG. 5, the present disclosure further provides a manufacturing method of the array substrate, which includes following steps.

S1: providing a substrate 10, forming a signal line 13 and a buffer layer 14 which covers the signal line 13 on the substrate 10, forming a shielding layer 15 and a first interlayer insulating layer 16 which covers the shielding layer 15 on the buffer layer 14, and forming a first active layer 21 on the first interlayer insulating layer 16.

Wherein, a manufacturing method of the first active layer 21 includes following steps: first, depositing a silicon oxide layer, a silicon nitride layer, and an a-Si layer on the buffer layer 14, and making the a-Si layer as an initial active layer and making the silicon oxide layer and the silicon nitride layer as the first interlayer insulating layer 16 by excimer laser annealing (ELA); and second, doping the initial active layer with the phosphorus ions to form an N+ source region and an N+ drain region.

S2: forming a first gate insulating layer 22 on the first interlayer insulating layer 16 and forming a first metal layer 23 on the first gate insulating layer 22, wherein, the first metal layer 23 includes a first gate electrode 232 and a source electrode 231, and the source electrode 231 is electrically connected to the signal line 13 and the first active layer 21 in sequence.

Wherein, the first gate insulating layer 22 is formed with at least one third through-hole (not marked in the figures) and at least one fourth through-hole (not marked in the figures), a portion of the signal line 13 is exposed by the fourth through-hole, and a portion of the first active layer 21 (the N+ source region) is exposed by the third through-hole. The source electrode 231 is electrically connected to the signal line 13 by the fourth through-hole, and the source electrode 231 is electrically connected to the first active layer 21 (the N+ source region) by the third through-hole.

Wherein, after the step of forming the first metal layer 23 on the first gate insulating layer, the method further includes a step of light doping with the phosphorus ions to form the N− lightly doped regions by the shielding of the first gate electrode. The N+ source region and an N− lightly doped region adjacent to the N+ source region constitute the first source region 212 of the first active layer 21. The N+ drain region and an N− lightly doped region adjacent to the N+ drain region constitute the first drain region 213 of the first active layer 21. A region of the first active layer 21 between the first drain region 213 and the first source region 212 is the first channel region 211. The first gate electrode 232 is disposed opposite to the first channel region 211.

S3: forming a second gate insulating layer 24 on the first metal layer 23, forming a second active layer 25 on the second gate insulating layer 24, forming a third gate insulating layer 26 that covers the second active layer 25 on the second gate insulating layer 24, forming a first through-hole 273 on the third gate insulating layer 26 toward the first active layer 21, and forming a third metal layer 27 on the third gate insulating layer 26, wherein, the third metal layer 27 includes an adapter terminal 271 electrically connected to the second source region 253 of the second active layer 25 and the first drain region 213 of the first active layer 21 by the first through-hole 273.

A second through-hole 274 is further defined on the third gate insulating layer 26 toward the shielding layer 15, the third metal layer 27 further includes a first signal terminal 272, and the first signal terminal 272 is electrically connected to the shielding layer 15 by the second through-hole 274.

Wherein, before the step of forming the third gate insulating layer 26 that covers the second active layer 25 on the second gate insulating layer 24, the method further includes the step of doping the initial active layer with the phosphorus ions to form the N+ source region and the N+ drain region. After the step of forming the third metal layer 27 on the third gate insulating layer 26, the method further includes the step of light doping with the phosphorus ions to form the N− lightly doped regions.

In this embodiment, the N+ source region of the second active layer 25 and an N− lightly doped region adjacent to the N+ source region constitute the second source region 253. The N+ drain region and an N− lightly doped region adjacent to the N+ drain region constitute the second drain region 252. A region of the second active layer 25 between the second drain region 252 and the second source region 253 is the second channel region 251. The first gate electrode 232 is disposed opposite to the second channel region 251. The first gate electrode 232 controls the first active layer 21 and the second active layer 25 simultaneously.

In other embodiments, the third metal layer 27 further includes a second gate electrode 276 disposed opposite to the second channel region 251. The first gate electrode 232 controls the first active layer 21, and the second gate electrode 276 controls the second active layer 25. Wherein, the second gate electrode 276 can be used as a shield for light doping with the phosphorus ions to form the N− lightly doped regions.

S4: forming a second interlayer insulating layer 28 that covers the third metal layer 27 on the third gate insulating layer 26, and forming a second metal layer 29 on the second interlayer insulating layer 28, wherein, the second metal layer 29 includes a drain electrode 291 electrically connected to the second drain region 252 of the second active layer 25.

Wherein, the second metal layer 29 further includes the second signal terminal 292. The second signal terminal 292 and the drain electrode 291 are disposed on the same layer and made of the same material.

S5: forming a planarization layer 31 on the second interlayer insulating layer 28, forming a pixel electrode 50 on the planarization layer 31, and forming a protective layer 40 that covers the pixel electrode 50 on the planarization layer 31, wherein, the pixel electrode 50 is electrically connected to the drain electrode 291, thereby obtaining the array substrate 100 or 200.

In this embodiment, after the step of forming the protective layer 40 that covers the pixel electrode 50 on the planarization layer 31, the method further includes a step of forming a common electrode 60 on the protective layer 40, and the common electrode 60 is electrically connected to the second signal terminal 292.

In other embodiments, the array substrate 100 or 200 may also not formed with the common electrode.

In the array substrate provided in the embodiments, by disposing the first active layer 21 and the second active layer 25 in the stack in the direction perpendicular to the substrate 10, electrically connecting the first active layer 21 to the second active layer 25, and controlling the first active layer 21 by the first gate electrode 232 and controlling the second active layer 25 by the second gate electrode 276 or controlling the first active layer 21 and the second active layer 25 simultaneously by the first gate electrode 232, the length of the channel regions (the first channel region 211 and the second channel region 251) of the drive transistor 20 can be increased. Therefore, the problem of device stability can be solved, and the area occupied by the drive transistor 20 on the substrate is not increased.

The array substrate, the display panel, and the display terminal provided by the embodiments of the present disclosure are described in detail above. The specific examples are applied in the description to explain the principle and implementation of the disclosure. The description of the above embodiments is only for helping to understand the technical solution of the present disclosure and its core ideas, and it is understood that many changes and modifications to the described embodiment can be carried out without departing from the scope and the spirit of the disclosure that is intended to be limited only by the appended claims.

What is claimed is:

1. An array substrate, comprising:
   a substrate;
   a first active layer disposed on the substrate, wherein the first active layer comprises a first source region, a first drain region, and a first channel region located between the first source region and the first drain region;
   a first metal layer disposed on the first active layer, wherein the first metal layer comprises a source electrode and a first gate electrode, the source electrode is electrically connected to the first source region of the first active layer, and the first gate electrode is disposed opposite to the first channel region of the first active layer;
   a second active layer disposed on the first metal layer and opposite to the first active layer, wherein the second active layer comprises a second source region, a second drain region, and a second channel region located between the second source region and the second drain region, the second source region of the second active layer is electrically connected to the first drain region of the first active layer, and the first gate electrode is disposed opposite to the second channel region of the second active layer; and
   a second metal layer disposed on the second active layer, wherein the second metal layer comprises a drain electrode electrically connected to the second drain region of the second active layer.

2. The array substrate according to claim 1, further comprising a third metal layer disposed between the second active layer and the second metal layer, wherein the third metal layer comprises an adapter terminal electrically connected to both the first drain region of the first active layer and the second source region of the second active layer.

3. The array substrate according to claim 2, wherein the first gate electrode controls the first active layer and the second active layer simultaneously.

4. The array substrate according to claim 3, further comprising a signal line and a shielding layer, wherein the signal line is disposed on the substrate, a projection of the first active layer on the signal line is within the signal line, the source electrode is electrically connected to the signal line, and the shielding layer is disposed between the signal line and the first active layer; and
   the third metal layer further comprises a first signal terminal electrically connected to the shielding layer.

5. The array substrate according to claim 4, further comprising a pixel electrode disposed on the second metal layer and electrically connected to the drain electrode.

6. The array substrate according to claim 5, wherein the second metal layer further comprises a second signal terminal, the array substrate further comprises a common electrode disposed on the second metal layer and opposite to the pixel electrode, and the common electrode is electrically connected to the second signal terminal.

7. The array substrate according to claim 4, further comprising a first gate insulating layer, a second gate insulating layer, and a third gate insulating layer, wherein the first gate insulating layer is disposed between the first active layer and the first metal layer, the second gate insulating layer is disposed between the first metal layer and the second active layer, the third gate insulating layer is disposed between the second active layer and the third metal layer, and the third metal layer is disposed on the third gate insulating layer; the array substrate further comprises a first through-hole penetrating through the first gate insulating layer, the second gate insulating layer, and the third gate insulating layer; and the first through-hole is filled with a conductive material having a same material as the adapter terminal, and the adapter terminal is electrically connected to the first active layer and the second active layer by the conductive material in the first through-hole.

8. The array substrate according to claim 7, wherein the first through-hole further penetrates through the second active layer; or
   one end of the first active layer and one end of the second active layer are exposed from the first through-hole and electrically connected to the conductive material.

9. The array substrate according to claim 2, wherein the third metal layer further comprises a second gate electrode disposed opposite to the second active layer, the first gate electrode controls the first active layer, and the second gate electrode controls the second active layer.

10. A display panel, comprising an opposite substrate and an array substrate, wherein the opposite substrate is disposed opposite to the array substrate and away from a substrate, and the array substrate comprises:
    the substrate;
    a first active layer disposed on the substrate, wherein the first active layer comprises a first source region, a first drain region, and a first channel region located between the first source region and the first drain region;
    a first metal layer disposed on the first active layer, wherein the first metal layer comprises a source electrode and a first gate electrode, the source electrode is electrically connected to the first source region of the first active layer, and the first gate electrode is disposed opposite to the first channel region of the first active layer;
    a second active layer disposed on the first metal layer and opposite to the first active layer, wherein the second active layer comprises a second source region, a second drain region, and a second channel region located between the second source region and the second drain region, the second source region of the second active layer is electrically connected to the first drain region of the first active layer, and the first gate electrode is disposed opposite to the second channel region of the second active layer; and
    a second metal layer disposed on the second active layer, wherein the second metal layer comprises a drain electrode electrically connected to the second drain region of the second active layer.

11. The display panel according to claim 10, wherein the array substrate further comprises a third metal layer disposed between the second active layer and the second metal layer, and the third metal layer comprises an adapter terminal electrically connected to both the first drain region of the first active layer and the second source region of the second active layer.

12. The display panel according to claim 11, wherein the first gate electrode controls the first active layer and the second active layer simultaneously.

13. The display panel according to claim 12, wherein the array substrate further comprises a signal line and a shielding layer, the signal line is disposed on the substrate, a projection of the first active layer on the signal line is within the signal line, the source electrode is electrically connected to the signal line, and the shielding layer is disposed between the signal line and the first active layer; and the third metal layer further comprises a first signal terminal electrically connected to the shielding layer.

14. The display panel according to claim 13, wherein the array substrate further comprises a pixel electrode disposed on the second metal layer and electrically connected to the drain electrode.

15. The display panel according to claim 14, wherein the second metal layer further comprises a second signal terminal, the array substrate further comprises a common electrode disposed on the second metal layer and opposite to the pixel electrode, and the common electrode is electrically connected to the second signal terminal.

16. The display panel according to claim 11, wherein the third metal layer further comprises a second gate electrode disposed opposite to the second active layer, the first gate electrode controls the first active layer, and the second gate electrode controls the second active layer.

17. A display terminal, comprising a main body and a display panel fixed onto the main body, wherein the display panel comprises an opposite substrate and an array substrate, the opposite substrate is disposed opposite to the array substrate and away from a substrate, and the array substrate comprises:

the substrate;

a first active layer disposed on the substrate, wherein the first active layer comprises a first source region, a first drain region, and a first channel region located between the first source region and the first drain region;

a first metal layer disposed on the first active layer, wherein the first metal layer comprises a source electrode and a first gate electrode, the source electrode is electrically connected to the first source region of the first active layer, and the first gate electrode is disposed opposite to the first channel region of the first active layer;

a second active layer disposed on the first metal layer and opposite to the first active layer, wherein the second active layer comprises a second source region, a second drain region, and a second channel region located between the second source region and the second drain region, the second source region of the second active layer is electrically connected to the first drain region of the first active layer, and the first gate electrode is disposed opposite to the second channel region of the second active layer; and a second metal layer disposed on the second active layer, wherein the second metal layer comprises a drain electrode electrically connected to the second drain region of the second active layer.

18. The display terminal according to claim 17, wherein the array substrate further comprises a third metal layer disposed between the second active layer and the second metal layer, and the third metal layer comprises an adapter terminal electrically connected to both the first drain region of the first active layer and the second source region of the second active layer.

19. The display terminal according to claim 18, wherein the first gate electrode controls the first active layer and the second active layer simultaneously.

20. The display terminal according to claim 18, wherein the third metal layer further comprises a second gate electrode disposed opposite to the second active layer, the first gate electrode controls the first active layer, and the second gate electrode controls the second active layer.

* * * * *